US006716686B1

(12) United States Patent
Buynoski et al.

(10) Patent No.: US 6,716,686 B1
(45) Date of Patent: Apr. 6, 2004

(54) METHOD FOR FORMING CHANNELS IN A FINFET DEVICE

(75) Inventors: Matthew S. Buynoski, Palo Alto, CA (US); Judy Xilin An, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/613,997

(22) Filed: Jul. 8, 2003

(51) Int. Cl.[7] .................... H01L 21/00; H01L 21/336
(52) U.S. Cl. .................... 438/157; 438/161; 438/197; 438/283; 438/585
(58) Field of Search ................. 438/157, 156, 438/149, 161, 283, 284, 585

(56) References Cited

U.S. PATENT DOCUMENTS

| 4,996,574 | A | * | 2/1991 | Shirasaki | 257/66 |
| 5,338,959 | A | * | 8/1994 | Kim et al. | 257/331 |
| 5,932,911 | A | | 8/1999 | Yue et al. | 257/330 |
| 6,180,441 | B1 | | 1/2001 | Yue et al. | 438/197 |
| 6,413,802 | B1 | * | 7/2002 | Hu et al. | 438/151 |
| 6,562,665 | B1 | * | 5/2003 | Yu | 438/149 |
| 6,583,469 | B1 | * | 6/2003 | Fried et al. | 257/329 |

OTHER PUBLICATIONS

Digh Hisamoto et al., "FinFET–A Self–Aligned Double––Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

* cited by examiner

*Primary Examiner*—Michael Trinh
(74) *Attorney, Agent, or Firm*—Harrity & Snyder, LLP

(57) ABSTRACT

A method for forming one or more FinFET devices includes forming a source region and a drain region in an oxide layer, where the oxide layer is disposed on a substrate, and etching the oxide layer between the source region and the drain region to form a group of oxide walls and channels for a first device. The method further includes depositing a connector material over the oxide walls and channels for the first device, forming a gate mask for the first device, removing the connector material from the channels, depositing channel material in the channels for the first device, forming a gate dielectric for first device over the channels, depositing a gate material over the gate dielectric for the first device, and patterning and etching the gate material to form at least one gate electrode for the first device.

20 Claims, 8 Drawing Sheets

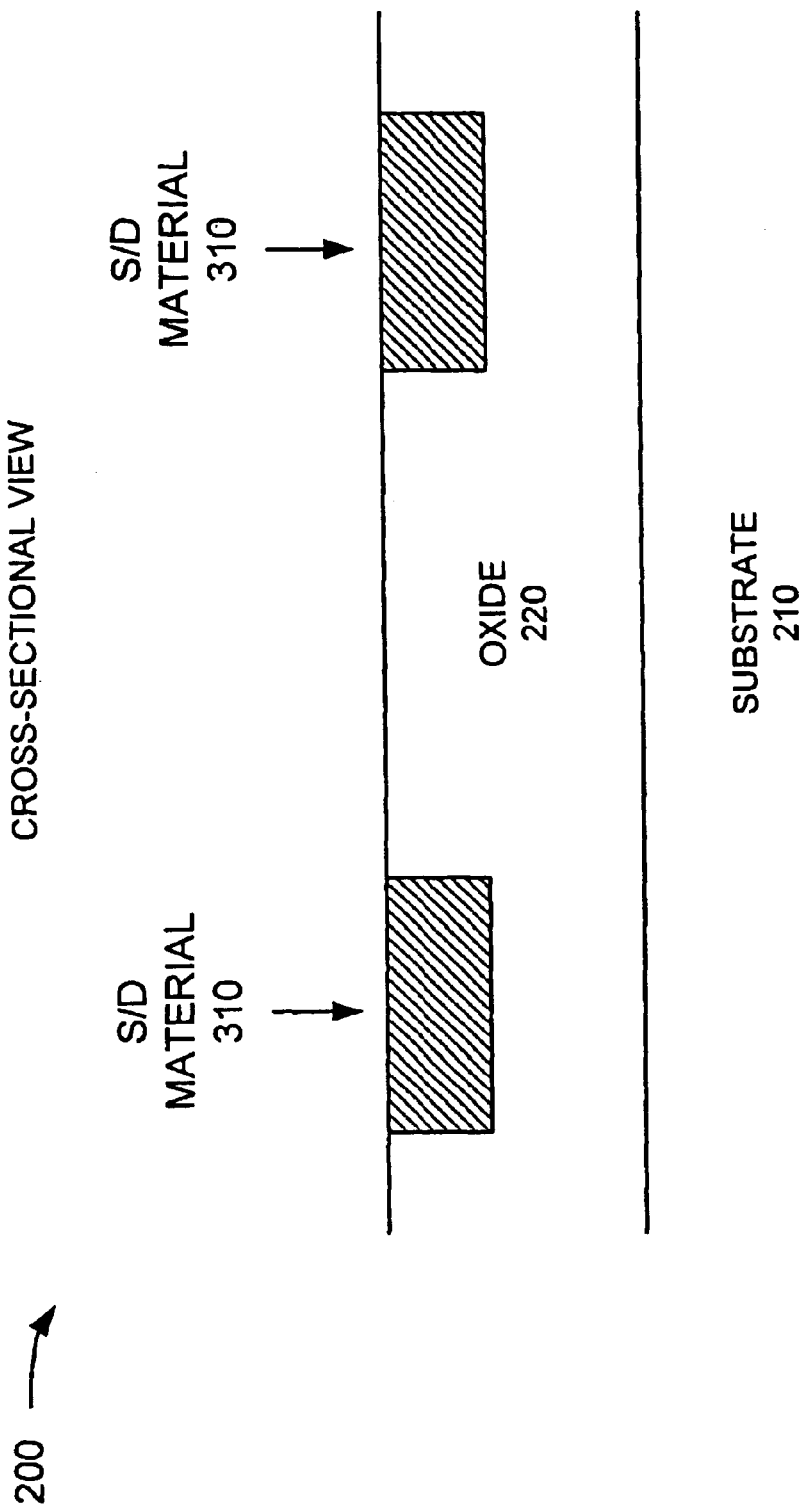

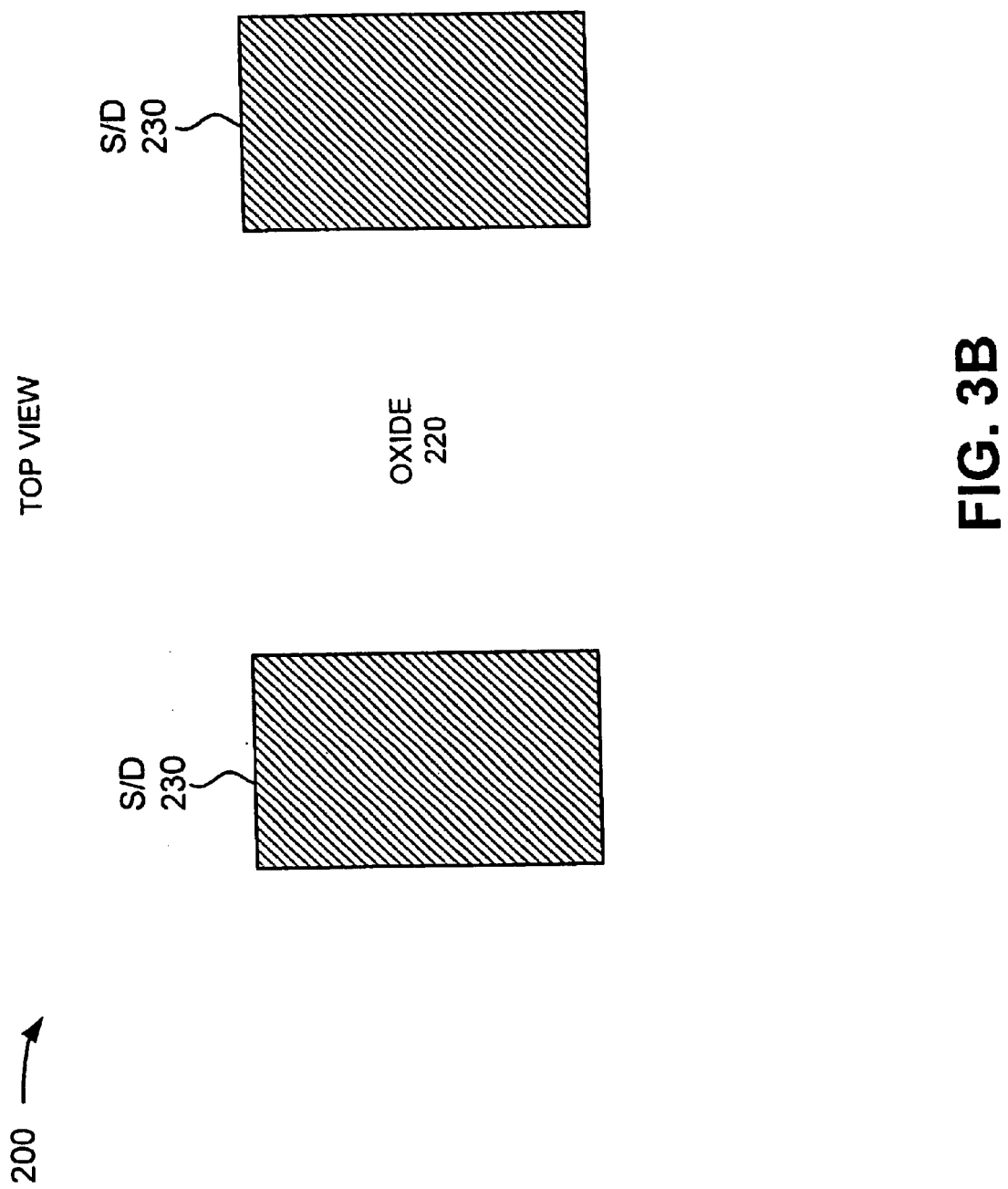

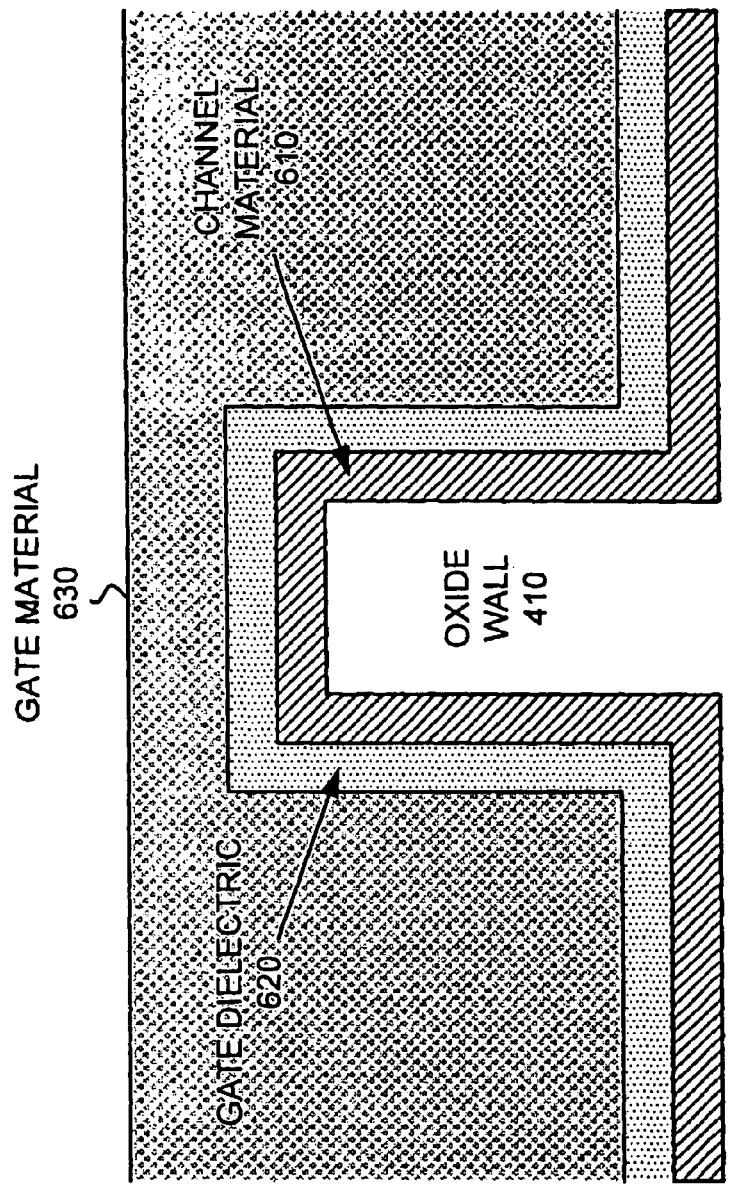

METHOD FOR FORMING CHANNELS IN A FINFET DEVICE

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 50 nanometers (nm), high reliability and increased manufacturing throughput. The reduction of design features below 50 nm challenges the limitations of conventional methodology.

For example, when the gate length of conventional planar metal oxide semiconductor field effect transistors (MOSFETs) is scaled below 50 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the principles of the invention form multiple FinFET devices having an increased effective channel width. A group of channels are formed between the source and drain regions of each FinFET device. These channels increase the effective width of the channel region and, therefore, the current carrying capacity of the FinFET devices.

In accordance with the purpose of this invention as embodied and broadly described herein, a method for forming one or more FinFET devices includes forming a source region and a drain region in an oxide layer, where the oxide layer is disposed on a substrate, and etching the oxide layer between the source region and the drain region to form a group of oxide walls and channels for a first device. The method further includes depositing a connector material over the oxide walls and channels for the first device, forming a gate mask for the first device, removing the connector material from the channels, depositing channel material in the channels for the first device, forming a gate dielectric for first device over the channels, depositing a gate material over the gate dielectric for the first device, and patterning and etching the gate material to form at least one gate electrode for the first device.

In another implementation consistent with the present invention, a method of manufacturing a semiconductor device that includes a substrate and a first layer formed on the substrate is provided. The method includes etching the first layer to form a source area and a drain area; filling the source and drain areas with a first material to form source and drain regions; forming a plurality of channels in the first layer between the source region and the drain region; depositing a connector material over the first layer between the source region and the drain region; forming a gate mask over the first layer between the source region and the drain region; removing the connector material in the plurality of channels; depositing a channel material in the plurality of channels; forming a gate dielectric over the channel material; depositing a gate material over the gate dielectric; and patterning and etching the gate material to form at least one gate electrode.

In yet another implementation consistent with the principles of the invention, a method for forming two devices on a substrate having a first layer formed thereon, where the first layer comprises one of an oxide and a nitride, is provided. The method includes forming a source region and a drain region in the first layer for a first device and a second device; forming a plurality of channels for the first device in the first layer between the source region and the drain region; depositing connector material for the first device over the first layer between the source region and the drain region; forming a gate mask for the first device over the first layer between the source region and the drain region; removing the connector material from the plurality of channels; depositing channel material for the first device in the plurality of channels; forming a gate dielectric over the channel material for the first device; depositing a gate material over the gate dielectric for the first device; forming at least one gate electrode from the gate material for the first device; and repeating, for the second device, the forming a plurality of channels, depositing connector material, forming a gate mask, removing the connector material, depositing channel material, forming a gate dielectric, depositing a gate material, and forming at least one gate electrode.

BRIEF DESCRIPTION OF THE DRAWINGS

The accompanying drawings, which are incorporated in and constitute a part of this specification, illustrate an embodiment of the invention and, together with the description, explain the invention. In the drawings, FIGS. 2–6 illustrate exemplary views of FinFET devices fabricated according to the processing described in FIGS. 1A and 1B.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention form multiple FinFET devices having an increased effective channel width. A group of channels are formed between the source and drain regions of each FinFET device. These channels increase the effective width of the channel region and, therefore, the current carrying capacity of the FinFet devices.

Exemplary Processing

Figure 1A:
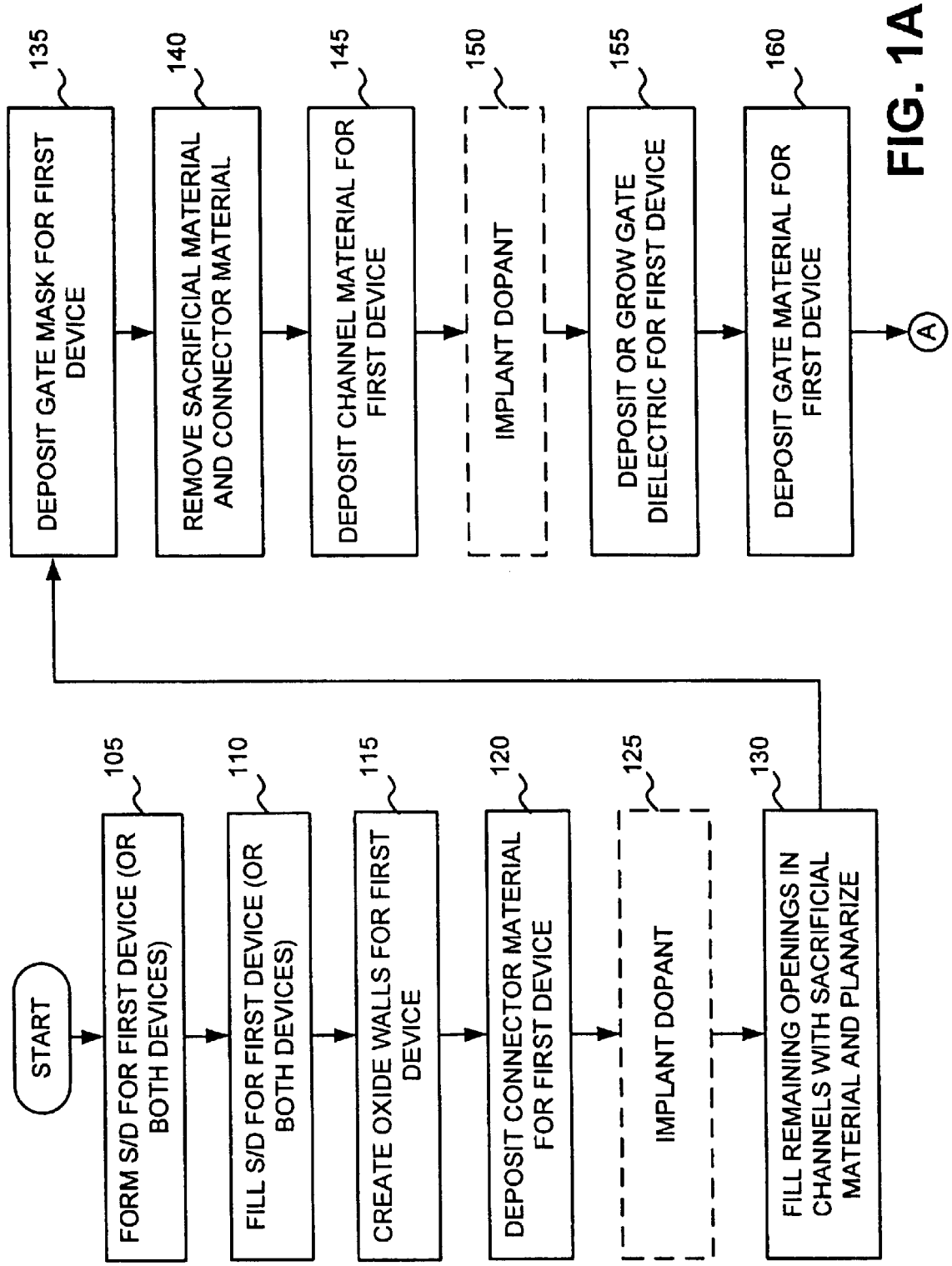
FIGS. 1A and 1B illustrate an exemplary process for forming multiple FinFET devices in an implementation consistent with the principles of the invention.
Figure 1B:
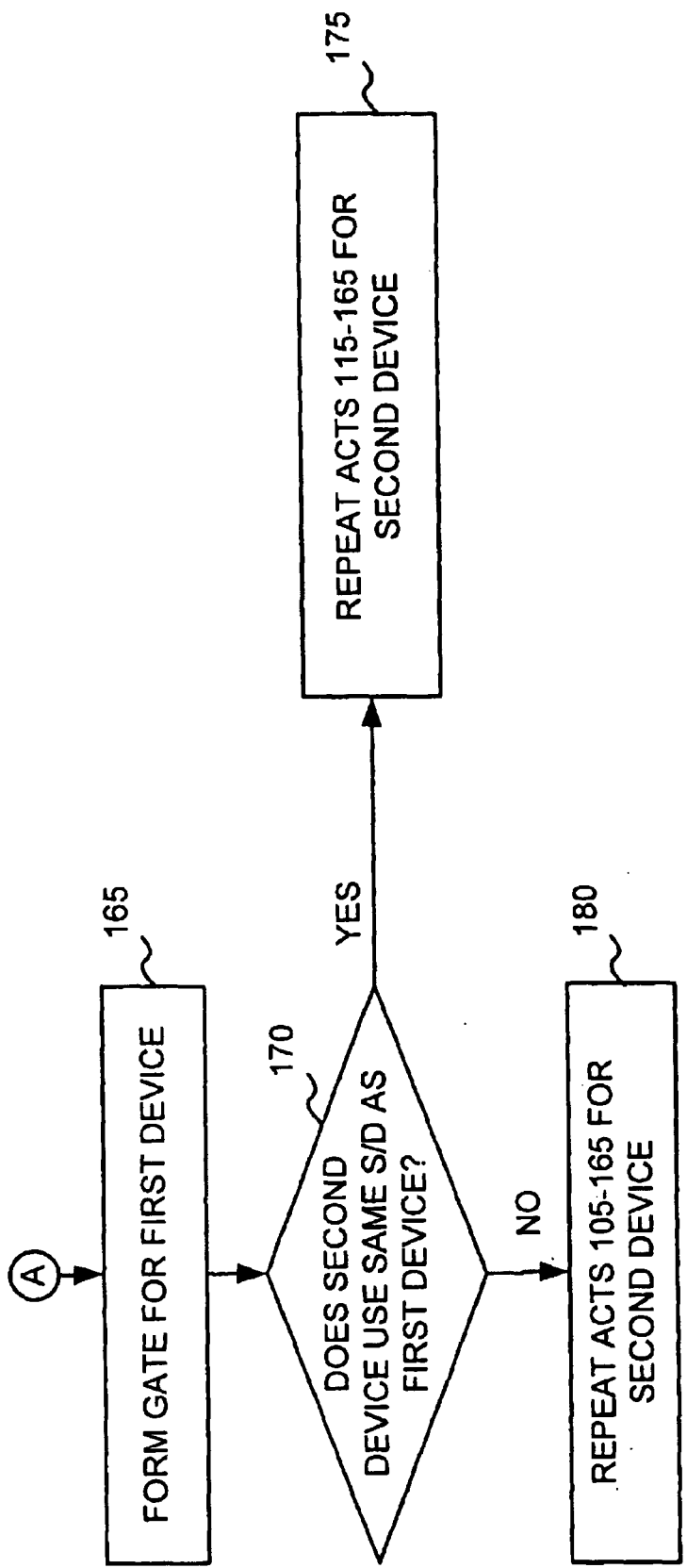

FIGS. 1A and 1B illustrate an exemplary process for fabricating multiple FinFET devices in an implementation consistent with the principles of the invention. FIGS. 2–6 illustrate exemplary views of a FinFET fabricated according to the processing described in FIGS. 1A and 1B. The fabrication of two FinFET devices will be described hereinafter. It will be appreciated, however, that the techniques described herein are equally applicable to forming more than two devices.

Figure 2:
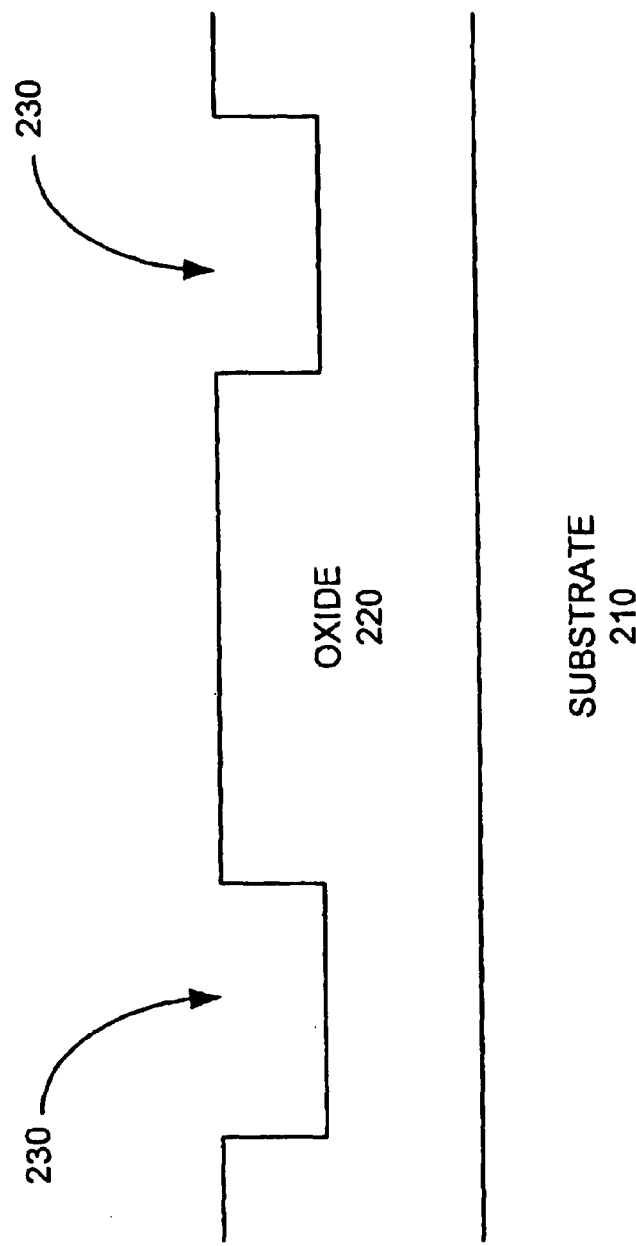

With reference to FIGS. 1A and 2, processing may begin by forming source and drain (S/D) regions 230 in an oxide-coated (or nitride-coated) wafer 210 (act 105). In device 200, oxide layer 220 may be formed on substrate 210 in a conventional manner. In one implementation consistent with the principles of the invention, oxide layer 220 may have a thickness ranging from about 1000 Å to about 5000 Å. The material comprising substrate 210 may be chosen for characteristics, such as thermal conductivity, coefficient of thermal expansion, dielectric properties, etc. In one implementation, substrate 210 consists of heavily-doped silicon. Other materials, such as beryllium oxide (BeO) or a metal, can alternatively be used.

S/D regions 230 may be opened in oxide layer 220 in a conventional manner (e.g., via etching) to a desired depth. S/D regions 230 may be formed for the first device alone, or for both the first and second devices. If substrate 210 is formed from a non-conductive material, the oxide layer 220 in the S/D regions 230 may be etched down to substrate 210. If, on the other hand, substrate 210 is formed from a conductive material, a barrier layer of oxide 220 may be left between S/D regions 230 and substrate 210, as illustrated in FIG. 2. In one implementation, the oxide layer 220 in S/D regions 230 is etched to a depth ranging from about 1000 Å to about 2000 Å.

S/D regions 230 may then be filled with a suitable material 310 for the source and drain, as illustrated in FIGS. 3A and 3B (act 110). S/D material 310 may consist of, for example, semiconductor material, such as silicon or germanium, a metal-like material, such as $CoSi_2$ or $RuO_2$, a refractory metal, such as Mo, or the like. Once the S/D regions 230 are filled, material 310 may be polished back (e.g., via a chemical-mechanical polish (CMP) procedure or other conventional technique) to planarize the surface.

Figure 4:
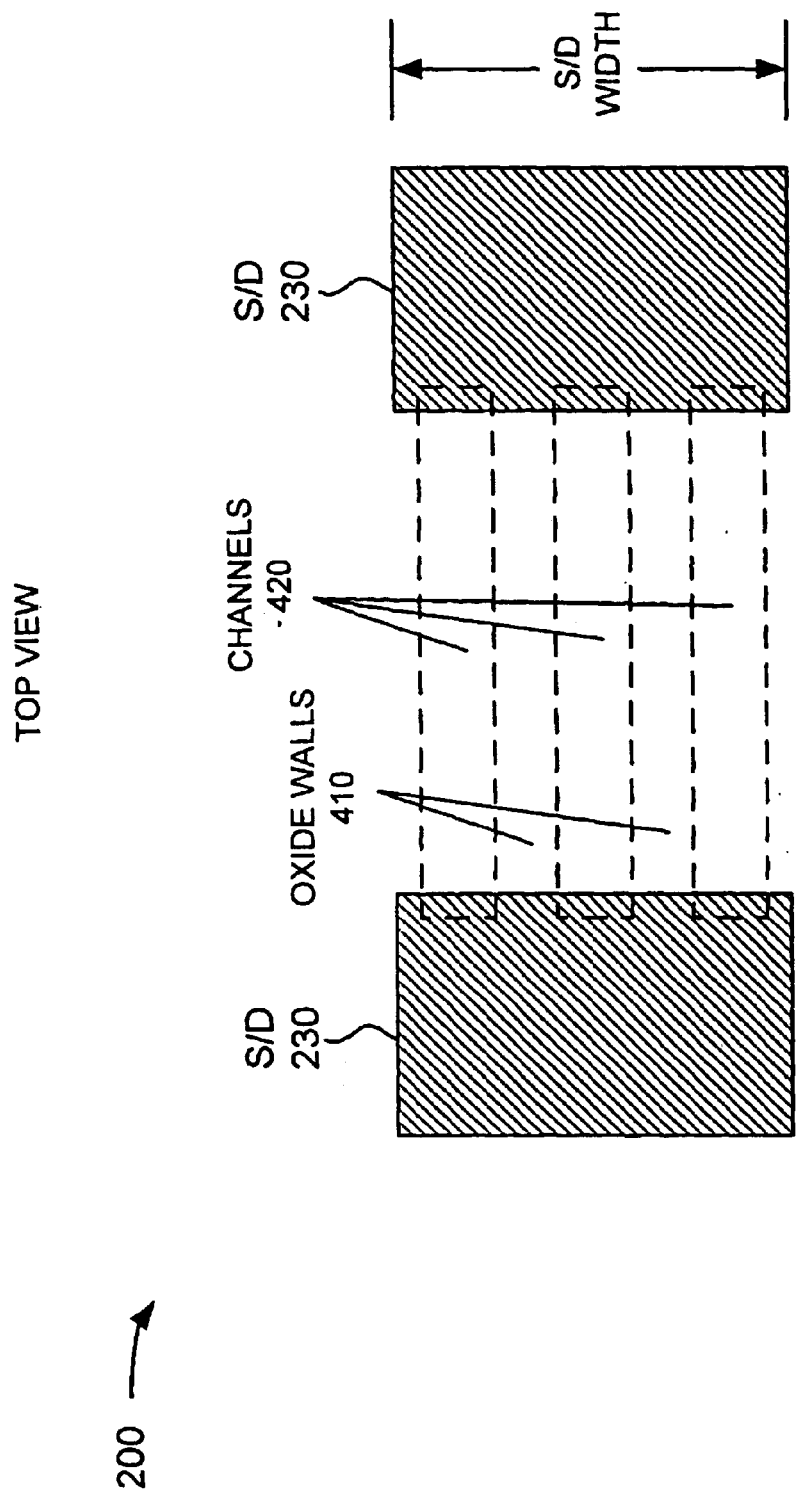

Next, the portion of oxide layer 220 between S/D regions 230 may be masked and etched to create thin walls of oxide 410 for the first device, as illustrated in FIG. 4 (act 115). The etched portion of oxide layer 220 is shown in FIG. 4 with dotted lines, leaving oxide walls 410. The dotted portions represent areas where the channels will subsequently be formed. Oxide walls 410 serve as the support for channel 420 materials, as will be described in detail below. In one implementation, channels 420 may be etched to the depth of S/D regions 230. However, in an exemplary implementation, channels regions 420 may not be etched down to substrate 210. The width of each channel 420 may range from about 1500 Å to about 2500 Å. The number of channels 420 may be set based on the width of S/D regions 230.

Connector material may be deposited on oxide walls 410 and channels 420 for the first device (act 120). The connector material may be, for example, a semiconductor material, such as silicon or germanium, a metal-like material, such as $CoSi_2$, $RuO_2$, etc., or a metal, such as aluminum (Al) or copper (Cu). The connector material may be formed/deposited in numerous ways, e.g., chemical vapor deposition (CVD), e.g., Al or thin silicon layer (followed by a thin cobalt layer by physical vapor deposition (PVD) to form silicide), or atomic layer deposition (ALD).

Once the connector material is deposited, a dopant may be deposited into the connector material, if necessary, to enhance the connectivity of the connector material (act 125). For example, the dopant may include conventional dopants, such as N-type or P-type dopants, based on the type of material used for the connector material. It will be appreciated that the connector material may be masked to remove the connector material from unwanted areas between transistors.

The remaining openings in channels 420 may then be filled with a sacrificial material and the surface planarized in a conventional manner (act 130). This act may be optional if the characteristics of the connector material chosen are suitable to filling the entire channel 420 depth and are also suitable for planarization and etching in subsequent acts. The sacrificial material is selected to have good etch selectivity to the connector material etched in the following gate etch. In one implementation, the sacrificial material may include plasma-deposited nitride or oxide.

Figure 5:
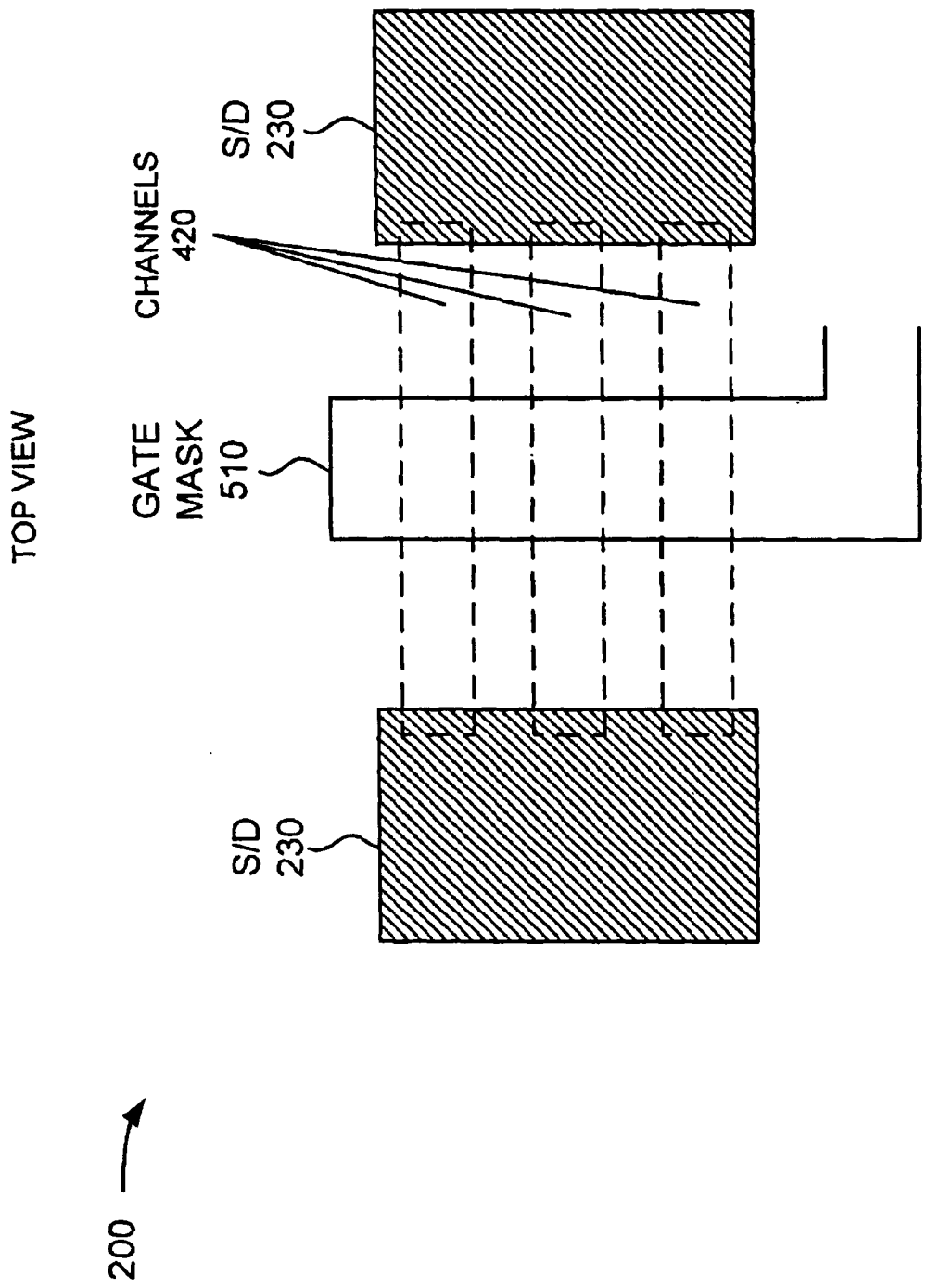

The surface of device 200 may then be masked with a gate mask 510 and etched for forming the gate across oxide walls 410 that are coated with the connector material, as illustrated in FIG. 5 (act 135). The gate may be etched in a conventional manner. The sacrificial material and connector material may then be removed from channels 420 via etching or other conventional technique (act 140). In one implementation, the removal of the sacrificial material and the connector material may be performed in different chambers using different etch chemistries. The particular etch chemistries may be selected based on the particular sacrificial material and connector material used. The removal of the sacrificial and connector materials may erode the tops of oxide walls 410 to a level below their original height. In one implementation, the height of oxide walls 410 may be reduced by approximately 300 Å.

Channel material 610 may then be deposited in channels 420 in a conventional manner for the first device, as illustrated in FIG. 6 (act 145). Channel material 610 may consist of a semiconductor material, such as silicon or germanium, deposited to a thickness ranging from about 300 Å to about 1500 Å to fill channels 420. For an N-type device, channel material 610 may include a thin layer (e.g., ranging from about 5 Å to about 10 Å) of a low carrier density metallic material, such as $RuO_2$. If necessary, channel material 610 may be appropriately doped in a well known manner (act 150). Channels 420 effectively act as a number fins for the FinFET device 200.

A gate dielectric material 620 may then be formed on channel material 610 for the first device, as illustrated in FIG. 6 (act 155). Dielectric material 620 may be deposited or thermally grown and may consist of a variety of materials, such as an oxide. A gate material 630 may be deposited for the first device, as illustrated in FIG. 6, and planarized back to a desired thickness (act 160). Gate material 630 may, for example, consist of a silicon layer, germanium layer, combinations of silicon and germanium or various metals. Gate material 630 may then be patterned and etched to form the gate electrodes for the first device (act 165, FIG. 1B). Once the gate electrodes have been formed, the first device is physically complete. If needed, thermal activation may be performed to activate the gate region and S/D regions 230 in the fist device.

The second device may then be created. In one implementation, the second device may be a different device than the first device. If the second device uses the same S/D regions 230 as the first device (act 170), the above-described acts 115 through 165 may be repeated for the second device (act 175). In this situation, the first device and the second device may use the same connector materials and channel materials. Accordingly, the first device and the second device can be made at the same time and the two types of devices (N-type and P-type) may be differentiated by selectively masking, and implanting the appropriate dopants.

If, on the other hand, the second device does not use the same S/D regions 230 as the first device (act 170), the above-described acts 105–165 may be repeated for the second device.

CONCLUSION

Implementations consistent with the principles of the invention form multiple FinFET devices having a number of fins, resulting in an increased effective channel width. A group of channels are formed between the source and drain regions of each FinFET device. These channels increase the effective width of the channel region and, therefore, the current carrying capacity of the FinFet devices.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIGS. 1A and 1B, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also as used herein, the article "a" is intended to include one or more items. Where only one item is intended, the term "one" or similar language is used.

The scope of the invention is defined by the claims and their equivalents.

What is claimed is:

1. A method for forming one or more FinFET devices, comprising:
   forming a source region and a drain region in an oxide layer, the oxide layer being disposed on a substrate;
   etching the oxide layer between the source region and the drain region to form a plurality of oxide walls, the areas between the plurality of oxide walls defining a plurality of respective channels for a first device;
   depositing a connector material over the plurality of oxide walls and channels for the first device;
   forming a gate mask for the first device;
   removing the connector material from the channels;
   depositing channel material in the channels for the first device;
   forming a gate dielectric for first device over the channels;
   depositing a gate material over the gate dielectric for the first device; and
   patterning and etching the gate material to form at least one gate electrode for the first device.

2. The method of claim 1 wherein the forming a source region and a drain region includes:
   forming the source region and a drain region to a depth ranging from about 1000 Å to about 2000 Å into the oxide layer.

3. The method of claim 1 wherein the forming a source region and a drain region includes:
   etching the oxide layer to form a source area and a drain area,
   filling the source area and the drain area with a first material.

4. The method of claim 1 wherein the etching the oxide layer between the source region and the drain region terminates at a depth of the source region and the drain region.

5. The method of claim 1 wherein a depth of the channels ranges from about 1000 Å to about 2000 Å into the top surface of the oxide layer.

6. The method of claim 1 further comprising:
   filling, prior to depositing a gate mask, openings in the channels with a sacrificial material, and
   wherein the removing the connector material includes:
      removing the sacrificial material and the connector material from the channels.

7. The method of claim 1 further comprising:
   repeating, for a second device, the forming a source region and a drain region in the oxide layer; etching the oxide layer between the source region and the drain region; depositing a connector material over the plurality of oxide walls and channels; forming a gate mask; removing the connector material; depositing channel material; forming a gate dielectric over the channel material; depositing a gate material over the gate dielectric; and patterning and etching the gate material to form at least one gate electrode.

8. The method of claim 1 wherein the source region and the drain region are used by the first device and a second device.

9. The method of claim 8 further comprising:
   repeating, for the second device, the etching the oxide layer between the source region and the drain region to form a plurality of oxide walls and channels; depositing a connector material over the plurality of oxide walls and channels; forming a gate mask; removing the connector material; depositing channel material; forming a gate dielectric over the channel material; depositing a gate material over the gate dielectric; and patterning and etching the gate material to form at least one gate electrode.

10. A method of manufacturing a semiconductor device that includes a substrate and a first layer formed on the substrate, comprising:
    etching the first layer to form a source area and a drain area;
    filling the source and drain areas with a first material to form source and drain regions;
    forming a plurality of channels in the first layer between the source region and the drain region;
    depositing a connector material over the first layer between the source region and the drain region;
    forming a gate mask over the first layer between the source region and the drain region;
    removing the connector material in the plurality of channels;

depositing a channel material in the plurality of channels;

forming a gate dielectric over the channel material;

depositing a gate material over the gate dielectric; and patterning and etching the gate material to form at least one gate electrode.

11. The method of claim 10 wherein a depth of the source area and the drain area ranges from about 1000 Å to about 2000 Å into an upper surface of the first layer.

12. The method of claim 10 wherein a depth of each of the plurality of channels ranges from about 1000 Å to about 2000 Å into an upper surface of the first layer.

13. The method of claim 10 wherein the first layer comprises one of an oxide and a nitride.

14. The method of claim 10 wherein a number of the plurality of channels is based on a width of the source region and the drain region.

15. The method of claim 10 further comprising:

repeating the etching the first layer to form a source area and a drain area; filling the source and drain areas with a first material to form source and drain regions; forming a plurality of channels in the first layer between the source region and the drain region; depositing a connector material over the first layer between the source region and the drain region; forming a gate mask over the first layer between the source region and the drain region; removing the connector material in the plurality of channels; depositing a channel material in the plurality of channels; forming a gate dielectric over the channel material; depositing a gate material over the gate dielectric; and patterning and etching the gate material to form at least one gate electrode for a second semiconductor device.

16. The method of claim 10 wherein the source region and the drain region are shared by the semiconductor device and a second semiconductor device.

17. The method of claim 16 further comprising:

repeating the forming a plurality of channels in the first layer between the source region and the drain region; depositing a connector material over the first layer between the source region and the drain region; forming a gate mask over the first layer between the source region and the drain region; removing the connector material in the plurality of channels; depositing a channel material in the plurality of channels; forming a gate dielectric over the channel material; depositing a gate material over the gate dielectric; and patterning and etching the gate material to form at least one gate electrode for a second semiconductor device.

18. A method for forming two devices on a substrate having a first layer formed thereon, the first layer comprising one of an oxide and a nitride, the method comprising:

forming a source region and a drain region in the first layer for a first device and a second device;

forming a plurality of channels for the first device in the first layer between the source region and the drain region;

depositing connector material for the first device over the first layer between the source region and the drain region;

forming a gate mask for the first device over the first layer between the source region and the drain region;

removing the connector material from the plurality of channels;

depositing channel material for the first device in the plurality of channels;

forming a gate dielectric over the channel material for the first device;

depositing a gate material over the gate dielectric for the first device;

forming at least one gate electrode from the gate material for the first device; and repeating, for the second device, the forming a plurality of channels, depositing connector material, forming a gate mask, removing the connector material, depositing channel material, forming a gate dielectric, depositing a gate material, and forming at least one gate electrode.

19. The method of claim 18 wherein a depth of each of the plurality of channels ranges from about 1000 Å to about 2000 Å into an upper surface of the first layer.

20. The method of claim 18 wherein a width of each of the plurality of channels ranges from about 1500 Å to about 2500 Å.

* * * * *